(12) United States Patent
Jung et al.

(10) Patent No.: US 11,069,755 B2
(45) Date of Patent: Jul. 20, 2021

(54) FLEXIBLE DISPLAY PANEL AND DISPLAY APPARATUS INCLUDING ELECTROCHROMIC PART

(71) Applicant: Samsung Display Co., Ltd., Yongin-si (KR)

(72) Inventors: Seung-Ho Jung, Hwaseong-si (KR); Chaun-Gi Choi, Suwon-si (KR); Yo-Seoph Ko, Gwacheon-si (KR); Ji-Hun Ryu, Hwaseong-si (KR); Tae-Kyung Ahn, Yongin-si (KR); Joo-Hee Jeon, Anyang-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 15/707,776

(22) Filed: Sep. 18, 2017

(65) Prior Publication Data

US 2018/0083075 A1    Mar. 22, 2018

(30) Foreign Application Priority Data

Sep. 22, 2016    (KR) .......................... 10-2016-0121754

(51) Int. Cl.
*H01L 27/32* (2006.01)
*H01L 51/00* (2006.01)
*H01L 51/52* (2006.01)

(52) U.S. Cl.
CPC ...... *H01L 27/3232* (2013.01); *H01L 27/3248* (2013.01); *H01L 51/0097* (2013.01);
(Continued)

(58) Field of Classification Search
None
See application file for complete search history.

(56) References Cited

U.S. PATENT DOCUMENTS

2007/0138941 A1* 6/2007 Jin ...................... H01L 27/3232
313/503
2009/0032096 A1* 2/2009 Tanaka .................. H01L 31/028
136/256
(Continued)

FOREIGN PATENT DOCUMENTS

KR    10-2014-0085972 A    7/2014
KR    10-2014-0135565 A    11/2014
(Continued)

OTHER PUBLICATIONS

Qirong Liu et al., "An all-thin-film inorganic electrochromic device monolithically fabricated on flexible PET/ITO substrate by magnetron sputtering" Materials Letters, May 21, 2014, pp. 232-234, vol. 142, Elsevier, China.
(Continued)

*Primary Examiner* — Erik Kielin
(74) *Attorney, Agent, or Firm* — Innovation Counsel LLP (57) ABSTRACT

A display panel includes a flexible electrochromic substrate comprising a first flexible substrate layer, a second flexible substrate layer opposing to the first flexible substrate layer and an electrochromic part disposed between the first and second flexible substrate layers and configured to discolor in response to a driving signal, a transistor layer disposed on the flexible electrochromic substrate, the transistor layer comprising a plurality of transistors and an organic light emitting diode layer disposed on the flexible electrochromic substrate on which the transistor layer is disposed, the organic light emitting diode layer comprising a plurality of organic light emitting diodes connected to the plurality of transistors.

20 Claims, 9 Drawing Sheets

(52) U.S. Cl.
CPC . *H01L 51/5253* (2013.01); *G09G 2300/0439* (2013.01); *Y02E 10/549* (2013.01)

(56) References Cited

U.S. PATENT DOCUMENTS

| | | | | |
|---|---|---|---|---|
| 2011/0163664 | A1* | 7/2011 | Kang | H01L 27/3232 313/504 |
| 2011/0267279 | A1* | 11/2011 | Alvarez Rivera | H01L 27/3232 345/173 |
| 2014/0117316 | A1* | 5/2014 | Choi | H01L 27/3246 257/40 |
| 2015/0077316 | A1* | 3/2015 | Sato | G09G 3/3208 345/77 |
| 2015/0251604 | A1* | 9/2015 | Kukita | G02F 1/155 359/266 |
| 2016/0285017 | A1* | 9/2016 | Liu | H01L 51/52 |
| 2016/0299387 | A1* | 10/2016 | Yamazaki | H01L 27/3232 |
| 2017/0242313 | A1* | 8/2017 | Eveborn | G02F 1/153 |

FOREIGN PATENT DOCUMENTS

| | | |
|---|---|---|
| KR | 10-2016-0050853 A | 5/2016 |
| KR | 10-2016-0083236 A | 7/2016 |

OTHER PUBLICATIONS

Seo et al., "Crystalline State and Temperature-dependent Conductivity of Annealed ITO Thin Films," New Physics: Sae Mulli, Apr. 2016, pp. 392-397, vol. 66, No. 4, Daegu, Korea.

Kwang-Soon Ahn, "Post-annealing Effect of N-incorporated WO3 Films for Photoelectrochemical Cells," Clean Technology, Sep. 2009, pp. 202-209, vol. 15, No. 3, Gyeongbuk, Korea.

Cheng et al., "Ferroelectric lithium tantalate thin film derived from peroxide," Journal of Alloys and Compounds 402, May 2005, pp. 208-212, Ibaraki, Japan.

Todorovic et al., "Lithium-Niobate Ferroelectric Material Obtained by Glass Crystallization," Ceramics International 23, Jul. 2, 1995, 6 pp. Belgrade, Yugoslavia.

* cited by examiner

FLEXIBLE DISPLAY PANEL AND DISPLAY APPARATUS INCLUDING ELECTROCHROMIC PART

This application claims priority from and the benefit of Korean Patent Application No. 10-2016-0121754 filed on Sep. 22, 2016, which is hereby incorporated by reference for all purposes as if fully set forth herein.

BACKGROUND OF THE INVENTION

1. Field of the Invention

Exemplary embodiments of the inventive concept relate to a display panel and a display apparatus having the display panel. More particularly, example embodiments of the inventive concept relate to a display panel with adjustable transparency and a display apparatus having the display panel.

2. Description of the Related Art

Recently, various flat panel display devices have been developed to replace the traditional Cathode Ray Tube (CRT) display devices, which tend to be heavier and bulkier than their replacements. The flat panel display devices, for example, include a liquid crystal display (LCD) device, a field emission display (FED) device, a plasma display panel PDP, an organic light emitting diode (OLED) device, etc.

The OLED device has advantages such as rapid response speed and low power consumption because the OLED device among the flat panel display devices displays an image using an organic light emitting diode that emits a light based on recombination of electrons and holes.

BRIEF SUMMARY OF THE INVENTION

Exemplary embodiments of the inventive concept provide a display panel with adjustable transparency.

Exemplary embodiments of the inventive concept provide a display apparatus having the display panel.

According to an exemplary embodiment of the inventive concept, there is provided a display panel. The display panel includes a flexible electrochromic substrate comprising a first flexible substrate layer, a second flexible substrate layer opposing to the first flexible substrate layer and an electrochromic part disposed between the first and second flexible substrate layers and configured to discolor in response to a driving signal, a transistor layer disposed on the flexible electrochromic substrate, the transistor layer comprising a plurality of transistors and an organic light emitting diode layer disposed on the flexible electrochromic substrate on which the transistor layer is disposed, the organic light emitting diode layer comprising a plurality of organic light emitting diodes connected to the plurality of transistors.

In an exemplary embodiment, the electrochromic part may include a first electrode, a second electrode overlapping with the first electrode and an electrochromic layer disposed between the first and second electrodes.

In an exemplary embodiment, at least one of the first electrode and the second electrode in the electrochromic part may be patterned corresponding to a pixel.

In an exemplary embodiment, at least one of the first electrode and the second electrode in the electrochromic part may be patterned corresponding to a block area including a plurality of pixels.

In an exemplary embodiment, the flexible electrochromic substrate may comprise a display area in which the organic light emitting diodes are arranged and a peripheral area surrounding the display area, the display panel further including a first pad part disposed in the peripheral area of the first flexible substrate layer and configured to receive a driving signal for the electrochromic part.

In an exemplary embodiment, the first pad part may include a first pad electrode extending from the first electrode and a second pad electrode extending from the second electrode.

In an exemplary embodiment, the display panel may further include a second pad part disposed in the peripheral area of the second flexible substrate layer and configured to receive a driving signal for the plurality of transistors.

In an exemplary embodiment, the first pad part may be disposed adjacent to the second pad part.

In an exemplary embodiment, the second flexible substrate layer may expose the first pad part disposed in the peripheral area of the first flexible substrate layer.

In an exemplary embodiment, the electrochromic layer may cover edge areas of the first electrode and has a size greater than that of the first electrode.

In an exemplary embodiment, the electrochromic layer may cover edge areas of the second electrode and has a size greater than that of the second electrode.

In an exemplary embodiment, the flexible electrochromic substrate may further include a first barrier layer disposed on the first flexible substrate layer and a second barrier layer disposed between the electrochromic part and the second flexible substrate layer.

According to an exemplary embodiment of the inventive concept, there is provided a display apparatus. The display apparatus includes a display panel comprising a flexible electrochromic substrate may include a first flexible substrate layer, a second flexible substrate layer opposing to the first flexible substrate layer and an electrochromic part disposed between the first and second flexible substrate layers and configured to discolor in response to a driving signal, a transistor layer disposed on the flexible electrochromic substrate, the transistor layer comprising a plurality of transistors, and an organic light emitting diode layer comprising a plurality of organic light emitting diodes connected to the plurality of transistors, a first flexible circuit board disposed on the first flexible substrate layer and configured to provide the electrochromic part with a driving signal and a second flexible circuit board disposed on the second flexible substrate layer and configured to provide the plurality of transistors with a driving signal.

In an exemplary embodiment, the electrochromic part may include a first electrode, a second electrode overlapping with the first electrode and an electrochromic layer disposed between the first and second electrodes.

In an exemplary embodiment, at least one of the first electrode and the second electrode in the electrochromic part may be patterned corresponding to a pixel.

In an exemplary embodiment, at least one of the first electrode and the second electrode in the electrochromic part may be patterned corresponding to a block area including a plurality of pixels.

In an exemplary embodiment, the flexible electrochromic substrate may include a display area in which the organic light emitting diodes are arranged and a peripheral area surrounding the display area, the display panel further including a first pad part disposed in the peripheral area of the first flexible substrate layer and configured to receive a driving signal for the electrochromic part.

In an exemplary embodiment, the first pad part may include a first pad electrode extending from the first electrode and a second pad electrode extending from the second electrode.

In an exemplary embodiment, the display panel may further including a second pad part disposed in the peripheral area of the second flexible substrate layer and configured to receive a driving signal for the plurality of transistors.

In an exemplary embodiment, the first pad part may be disposed adjacent to the second pad part.

In an exemplary embodiment, the second flexible substrate layer may expose the first pad part disposed in the peripheral area of the first flexible substrate layer.

In an exemplary embodiment, the electrochromic layer may cover edge areas of the first electrode and has a size greater than that of the first electrode.

In an exemplary embodiment, the electrochromic layer may cover edge areas of the second electrode and has a size greater than that of the second electrode.

In an exemplary embodiment, the flexible electrochromic substrate may further include a first barrier layer disposed on the first flexible substrate layer and a second barrier layer disposed between the electrochromic part and the second flexible substrate layer.

According to the inventive concept, the flexible electrochromic substrate includes the electrochromic part disposed between the first and second flexible substrate layers, and thus, a transparency of the display panel may be adjusted. Therefore, a visibility may be improved in an outdoor environment having sunlight. In addition, the flexible electrochromic substrate includes the first and second barrier layers disposed between the first and second flexible substrate layers and thus may block moisture or water permeated from the outside into the display panel.

BRIEF DESCRIPTION OF THE DRAWINGS

The above and other features and advantages of the inventive concept will become more apparent in view of the description of detailed exemplary embodiments thereof below with reference to the accompanying drawings, in which.

DETAILED DESCRIPTION OF THE INVENTION

Hereinafter, the inventive concept will be explained in detail with reference to the accompanying drawings.

Figure 1:
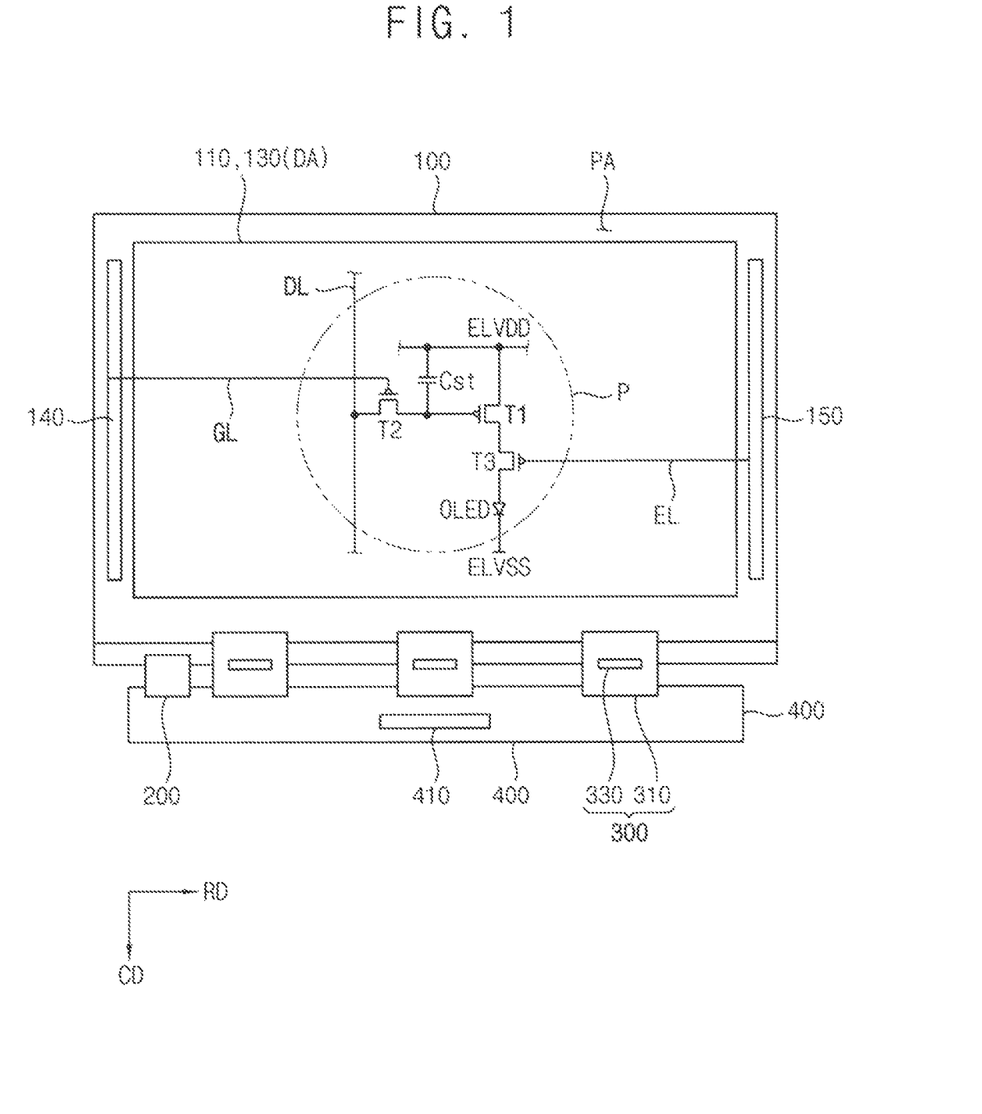
FIG. 1 is a plan view illustrating a display apparatus according to an exemplary embodiment.

FIG. 1 is a plan view illustrating a display apparatus according to an exemplary embodiment.

Referring to FIG. 1, the display apparatus may include a display panel 100, a first flexible circuit board 200, a second flexible circuit board 300 and a main circuit board 400.

The display panel 100 may include an electrochromic part 110, a display part 130, a gate driver 140 and an emission driver 150.

The electrochromic part 110 is configured to discolor in response to an electric signal. For example, the electrochromic part 110 may be configured to change from a colored state to a bleached stated or from the bleached stated to the colored state. For example, the electrochromic part 110 may be configured to drive with an opaque mode in which the electrochromic part 110 is driven with the colored state so that a visibility may be improved in an outdoor environment having sunlight and configured to drive with a transparent mode in which the electrochromic part 110 is driven with the bleached state so that a visibility may be improved in an indoor environment. The electrochromic part 110 is disposed in a display area DA of the display panel 100. Alternatively, the electrochromic part 110 may have a size larger than the display area DA and cover the display area DA despite a misalignment between the electrochromic part 110 and the display area DA and a difference between sizes of pixels disposed in an edge area and a central area of the display area DA.

The display part 130 is disposed in the display area DA in which the electrochromic part 110 is disposed and overlaps with the electrochromic part 110. The display part 130 may include a plurality of pixels P, a plurality of gate lines GL, a plurality of emission lines EL and a plurality of data lines DL. Each of pixels P may include a plurality of transistors that is connected to a gate line GL, an emission line EL and a data line DL, and an organic light emitting diode OLED that is connected to the plurality of transistors.

The data lines DL may extend in a column direction CD and be arranged in a row direction RD. The data lines DL are connected to the second flexible circuit board 300 and provide a data voltage to the pixels P.

The gate lines GL may extend in the row direction RD and be arranged in the column direction CD. The gate lines GL are connected to the gate driver 140 and provide a gate signal to the pixels P.

The emission lines EL may extend in the row direction RD and be arranged in the column direction CD. The emission lines EL are connected to the emission driver 150 and provide an emission control signal to the pixels P.

For example, the pixel P may include an organic light emitting diode OLED, a driving transistor T1, a capacitor CST, a switching transistor T2 and an emission control transistor T3.

The driving transistor T1 may include a control electrode connected to the switching transistor T2, a first electrode receiving the first emission power voltage ELVDD and a second electrode connected to the emission control transistor T3.

The capacitor CST may include a first electrode receiving the first emission power voltage ELVDD and a second electrode connected to the control electrode of the driving transistor T1.

The switching transistor T2 may include a control electrode receiving the gate signal G, a first electrode receiving the data voltage and a second electrode connected to the control electrode of the driving transistor T1.

The emission control transistor T3 may include a control electrode receiving an emission control signal, a first electrode connected to the second electrode of the driving transistor T1 and a second electrode connected to the organic light emitting OLED.

The organic light emitting diode OLED may include a first electrode connected to the emission control transistor T3 and a second electrode receiving the second emission power voltage ELVSS.

When the emission control transistor T3 is turned on, a current passed through the driving transistor T1 is applied to the organic light emitting diode OLED, and then the organic light emitting diode OLED emits a light. An emission period in which the organic light emitting diode OLED emits the light may be determined corresponding to an ON period in which the emission control transistor T3 is turned on.

The gate driver 140 is disposed in the peripheral area PA of the display panel 100 adjacent to an end portion of the gate line GL and is configured to provide the gate signal to the gate line GL.

The emission driver 150 is disposed in the peripheral area PA of the display panel 100 adjacent to an end portion of the emission line EL and is configured to provide an emission control signal to the emission line EL.

The first flexible circuit board 200 is mounted in the peripheral area PA of the display panel 100. For example, as shown in FIG. 1, the first flexible circuit board 200 may be mounted in the peripheral area PA adjacent to the second flexible circuit board 300.

The first flexible circuit board 200 is configured to provide a driving signal to the electrochromic part 110. For example, the electrochromic part 110 may include a first electrode, a second electrode overlapping with the first electrode and an electrochromic layer disposed between the first and second electrodes. When the driving signals are applied to the first and second electrodes of the electrochromic part 110, the electrochromic layer of the electrochromic part 110 may drive with the opaque mode corresponding to the colored state. However, when the driving signals are not applied to the first and second electrodes of the electrochromic part 110, the electrochromic layer of the electrochromic part 110 may drive with the transparent mode corresponding to the bleached state.

The second flexible circuit board 300 is mounted in the peripheral area PA of the display panel 100 adjacent to an end portion of the data line DL. The second flexible circuit board 300 may include a flexible circuit board 310 and a data driver 330. The data driver 330 is mounted on the flexible circuit board 310 and is configured to provide a data voltage to the data line DL.

The main circuit board 400 may include a control circuit 410. The control circuit 410 is configured to receive image data DATA, a control signal CONT and an electrochromic control signal CC. The image data DATA may include red, green and blue data. The control signal CONT may include a horizontal synchronization signal, a vertical synchronization signal and a main clock signal. The electrochromic control signal CC is a control signal that drives the electrochromic part 110 with the transparent mode or the opaque mode.

The control circuit 410 is configured to generate a plurality of control signals that controls the data driver 330, the gate driver 140 and the emission driver 150, using the horizontal synchronization signal, the vertical synchronization signal and the main clock signal. In addition, the control circuit 410 is configured to generate a driving signal for driving the electrochromic part 110 with the transparent mode or the opaque mode based on the electrochromic control signal CC.

Figure 2:
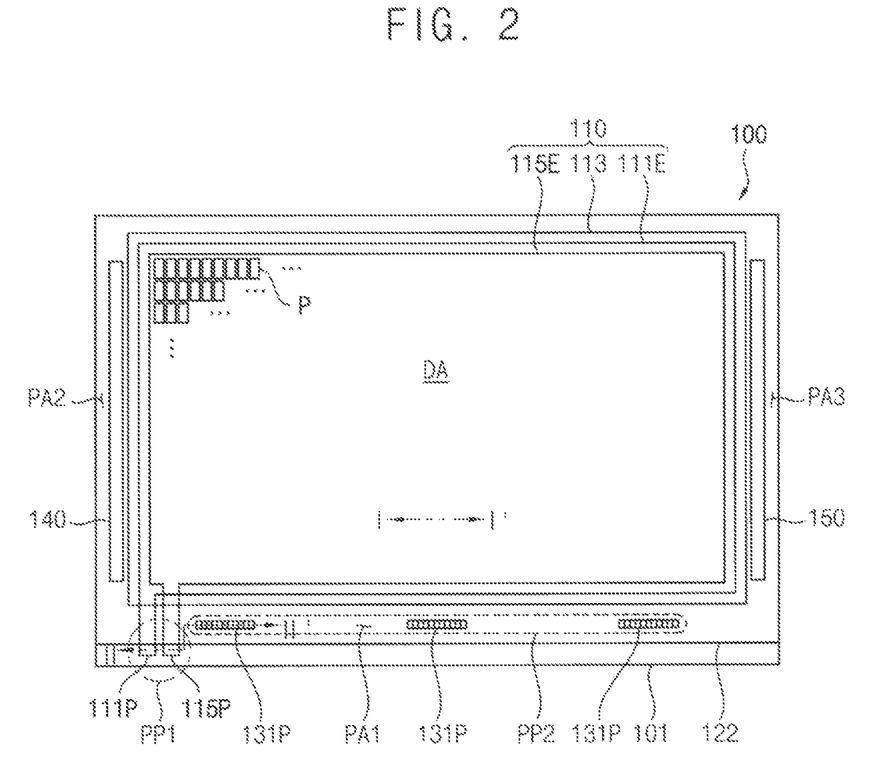
FIG. 2 is a plan view illustrating a display panel according to an exemplary embodiment.

FIG. 2 is a plan view illustrating a display panel according to an exemplary embodiment.

Referring to FIGS. 1 and 2, the display panel 100 may include a first flexible substrate layer 101, an electrochromic part 110, a first pad part PP1, a second flexible substrate layer 122, a display part 130, a gate driver 140, an emission driver 150 and a second pad part PP2.

The display panel 100 may include a display area DA and a plurality of peripheral areas PA1, PA2 and PA3 surrounding the display area DA.

The electrochromic part 110 is disposed in the display area DA of the first flexible substrate layer 101. The electrochromic part 110 may include a first transparent electrode 111E, an electrochromic layer 113 and a second transparent electrode 115E.

The first transparent electrode 111E is disposed in the display area DA of the first flexible substrate layer 101.

The electrochromic layer 113 overlaps with the first transparent electrode 111E and is disposed in the display area DA of the first flexible substrate layer 101. However, an edge area of the electrochromic layer 113 does not overlap with an edge area of the first transparent electrode 111E. As shown in FIG. 2, the electrochromic layer 113 may have a size larger than the first transparent electrode 111E to cover the edge area of the first transparent electrode 111E.

The second transparent electrode 115E overlaps with the electrochromic layer 113 and is disposed in the display area DA of the first flexible substrate layer 101. The second transparent electrode 115E may have a size smaller than the electrochromic layer 113 so that an edge area of the second transparent electrode 115E is disposed in an edge area of the electrochromic layer 113. Thus, the first and second transparent electrodes 111E and 115E do not contact to each other due to the electrochromic layer 113 disposed between the first and second transparent electrodes 111E and 115E.

The first pad part PP1 may include a first pad electrode 111P and a second pad electrode 115P.

The first pad electrode 111P is connected to the first transparent electrode 111E. The first pad electrode 111P may extend from the first transparent electrode 111E and be disposed in the first peripheral area PA1 of the first flexible substrate layer 101.

The second pad electrode 115P is connected to the second transparent electrode 115E. The second pad electrode 115P may extend from the second transparent electrode 115E and be disposed in the first peripheral area PA1 of the first flexible substrate layer 101 adjacent to the first pad electrode 111P.

Therefore, the first pad part PP1 on which the first flexible circuit board 200 is mounted may be disposed in the first peripheral area PA1 of the first flexible substrate layer 101.

The second flexible substrate layer 122 is disposed on the first flexible substrate layer 101 on which the electrochromic part 110 is disposed, and is opposite to the first flexible substrate layer 101. The electrochromic part 110 may be capsulated by the first and second flexible substrate layers 101 and 122.

The second flexible substrate layer 122 exposes the first peripheral area of the first flexible substrate layer 101 to expose the first pad part PP1.

The display part 130 is disposed in the display area DA of the second flexible substrate layer 122. The display part 130 may include a plurality of pixels P that is arranged as a matrix type. The pixel P may include the organic light emitting diode OLED, the driving transistor T1, the capacitor CST, the switching transistor T2 and the emission control transistor T3.

The gate driver 140 may be disposed in a second peripheral area PA2 of the second flexible substrate layer 122. The gate driver 140 may include a plurality of transistors and may be directly formed in the second peripheral area PA2 of the second flexible substrate layer 122 via substantially the same process for forming the transistors in the pixel P.

The emission driver 150 may be disposed in a third peripheral area PA3. The emission driver 150 may include a plurality of transistors, and the plurality of transistors may be directly formed in the third peripheral area PA3 of the second flexible substrate layer 122 via substantially the same process for forming the transistors in the pixel P.

The second pad part PP2 may include a plurality of signal pads 131P. The signal pads may be connected to the plurality of data lines, the gate driver 140 and the emission driver 150, which are disposed in the display part 100. The signal pads are connected to the second flexible circuit board 300.

Therefore, the second pad part PP2 on which the second flexible circuit board 300 is mounted may be disposed in the first peripheral area PA1 of the second flexible substrate layer 122.

Figure 3:
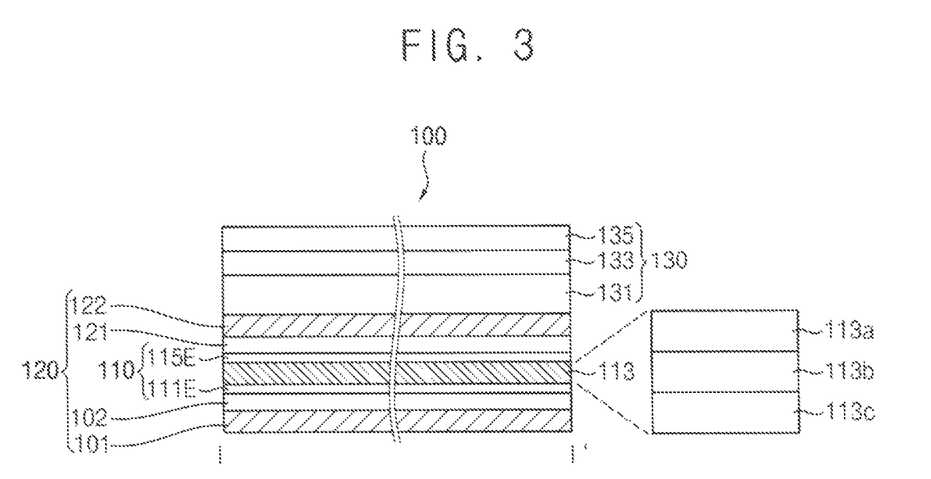
FIG. 3 is a cross-sectional view illustrating the display panel taken along line I-I' as shown in FIG. 2.

FIG. 3 is a cross-sectional view illustrating the display apparatus taken along line I-I' as shown in FIG. 2.

Referring to FIGS. 1, 2 and 3, the display panel 100 may include a flexible electrochromic substrate 120 and a display part 130.

The flexible electrochromic substrate 120 may include a first flexible substrate layer 101, a first barrier layer 102, an electrochromic part 110, a second barrier layer 121 and a second flexible substrate layer 122.

The first flexible substrate layer 101 may include transparent plastic, for example, polyimide, polyethylenenaphtalate, polyethyleneterephthalate, polyarylate, polycarbonate, polyrtherlmide, polyethersulfone, etc.

The first barrier layer 102 may include inorganic materials such as metallic oxide, silicon oxide and silicon oxide, etc. For example, the first barrier layer 102 may include AlO3, SiO2, SiNx, etc. These may be used alone or in a suitable combination thereof. The first barrier layer 102 may block moisture or water permeated from the outside.

The electrochromic part 110 may include a first transparent electrode 111E, an electrochromic layer 113 and a second transparent electrode 115E.

The first transparent electrode 111E may include transparent conductive materials. The transparent conductive materials may include indium tin oxide (ITO), indium zinc oxide (IZO), etc.

The electrochromic layer 113 may include inorganic materials. The electrochromic layer 113 may include a first electrode layer 113a, a conductor layer 113b and a second electrode layer 113c. The first electrode layer 113a may include WO3, etc., the conductor layer 113b may include LiNbO3, LiTaO3, etc, and the second electrode layer 113c may include NiO, etc.

The second transparent electrode 115E may include transparent conductive materials. The transparent conductive material may include indium tin oxide (ITO), indium zinc oxide (IZO), etc.

The second barrier layer 121 may include inorganic materials such as metallic oxide, silicon oxide, silicon oxide, etc. For example, the second barrier layer 121 may include AlO3, SiO2, SiNx, etc. These may be used alone or in a suitable combination thereof. The second barrier layer 121 may block moisture or water permeated from the outside.

The second flexible substrate layer 122 may include transparent plastic, for example, polyimide, polyethylenenaphtalate, polyethyleneterephthalate, polyarylate, polycarbonate, polyrtherlmide, polyethersulfone, etc.

The display part 130 may include a transistor layer 131, an OLED layer 133 and an encapsulation layer 135.

The transistor layer 131 may include a plurality of transistors in the plurality of pixels P. The OLED layer 133 may include a plurality of pixel electrodes connected to the plurality of transistors, a light-emitting layer disposed on the plurality of pixel electrodes and a common electrode disposed on the light-emitting layer.

The encapsulation layer 135 may be disposed on the OLED layer 133 and may protect the OLED layer 133 from external impacts.

Figure 4:
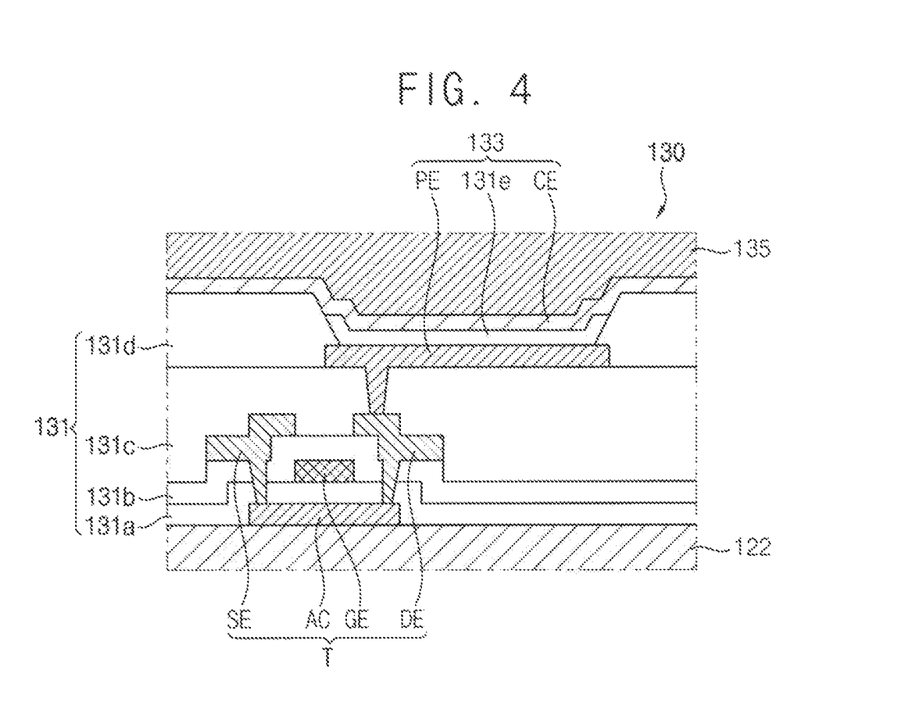
FIG. 4 is a cross-sectional view illustrating a display part according to an exemplary embodiment.

FIG. 4 is a cross-sectional view illustrating a display part according to an exemplary embodiment.

Referring to FIG. 4, the display part 130 may include a transistor T, a pixel electrode PE, an OLED layer 133 and an encapsulation layer 135.

The transistor T may include an active pattern AC, a gate electrode GE, a source electrode SE and a drain electrode DE. A gate insulating layer 131a may be disposed between the active pattern AC and the gate electrode GE. The active pattern AC may be formed of a semiconductor oxide including a binary compound (ABx), a ternary compound (ABxCy), a quaternary compound (ABxCyDz), etc. which contain indium, zinc, gallium, tin, titanium, aluminum, hafnium (Hf), zirconium (Zr), magnesium (Mg), etc. These compounds may be used alone or in combination thereof. The gate insulating layer 131a may include silicone compound, metallic oxide, etc.

An intercalation insulating layer 131b may be disposed between the gate electrode GE and the source/drain electrodes SE/DE. The intercalation insulating layer 131b may include silicon nitride, silicon oxide, silicon oxynitride, etc. A passivation layer 131c may be disposed on the transistor T. The passivation layer 131c may be disposed as a substantially uniform thickness along a profile of the transistor layer 131 and protect the transistor T.

The OLED layer 133 may include a pixel electrode PE, a light-emitting layer 131e and a common electrode CE, which are disposed on the passivation layer 131c.

The pixel electrode PE may be disposed on the passivation layer 131c and be connected to the transistor T. A pixel definition layer 131d may be disposed on the passivation layer 131c on which the pixel electrode PE is disposed. The light-emitting layer 131e may be disposed in an opening formed by the pixel definition layer 131d. The common electrode CE may be disposed on the light-emitting layer 131e.

The encapsulation layer 135 may be disposed on the common electrode CE. The encapsulation layer 135 may include a plurality of inorganic layers or a suitable combination thereof.

Figure 5:
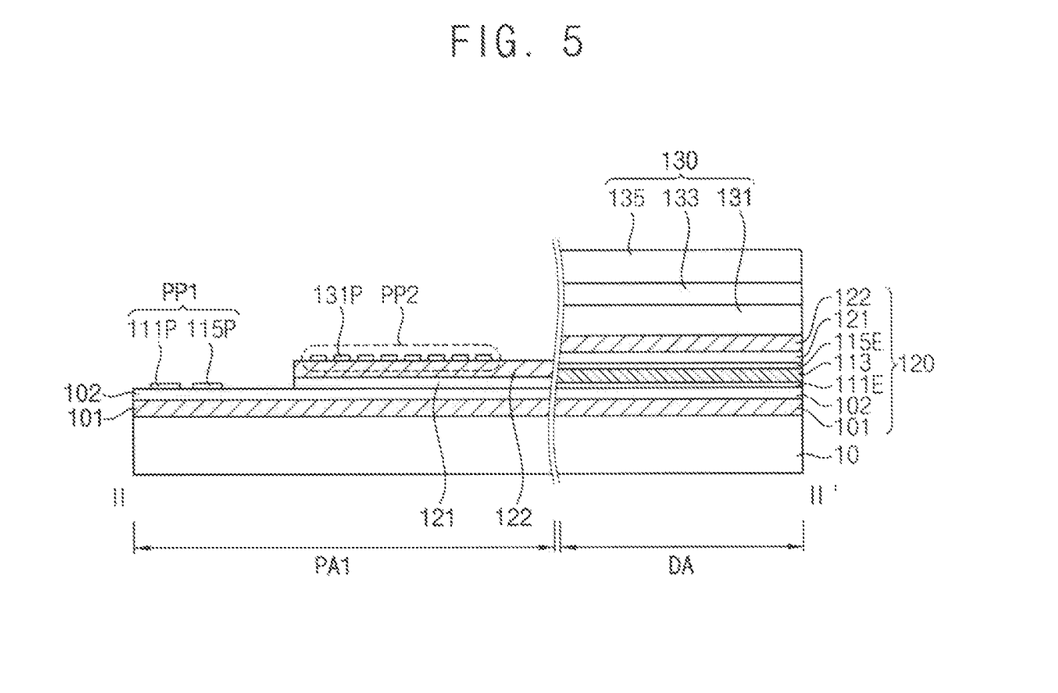
FIGS. 5 and 6 are cross-sectional views illustrating one method of manufacturing a display panel according to an exemplary embodiment.
Figure 6:
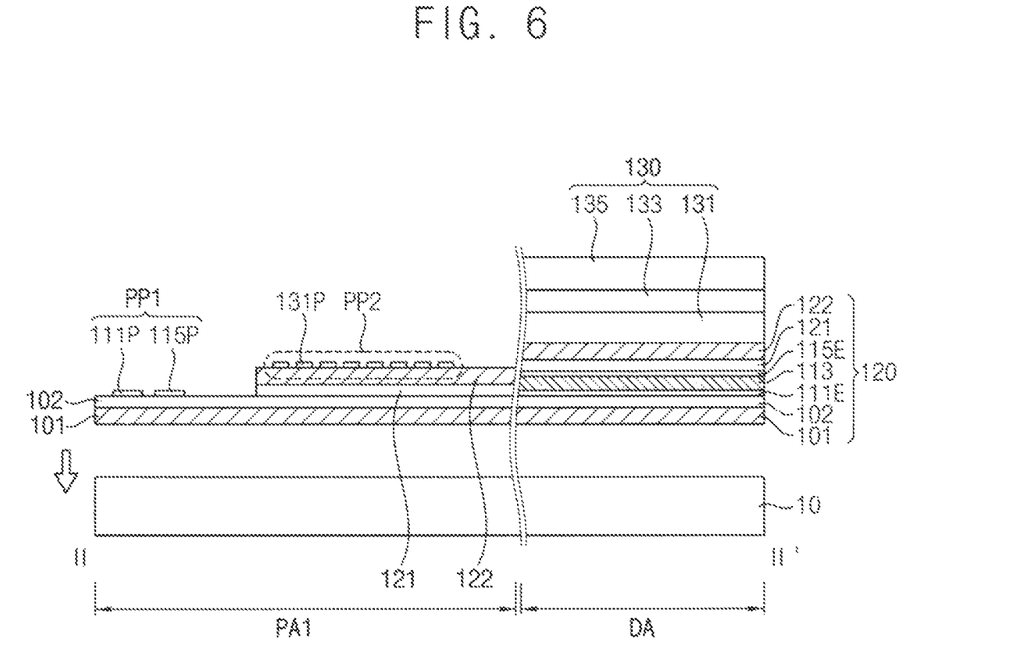
Figure 7:
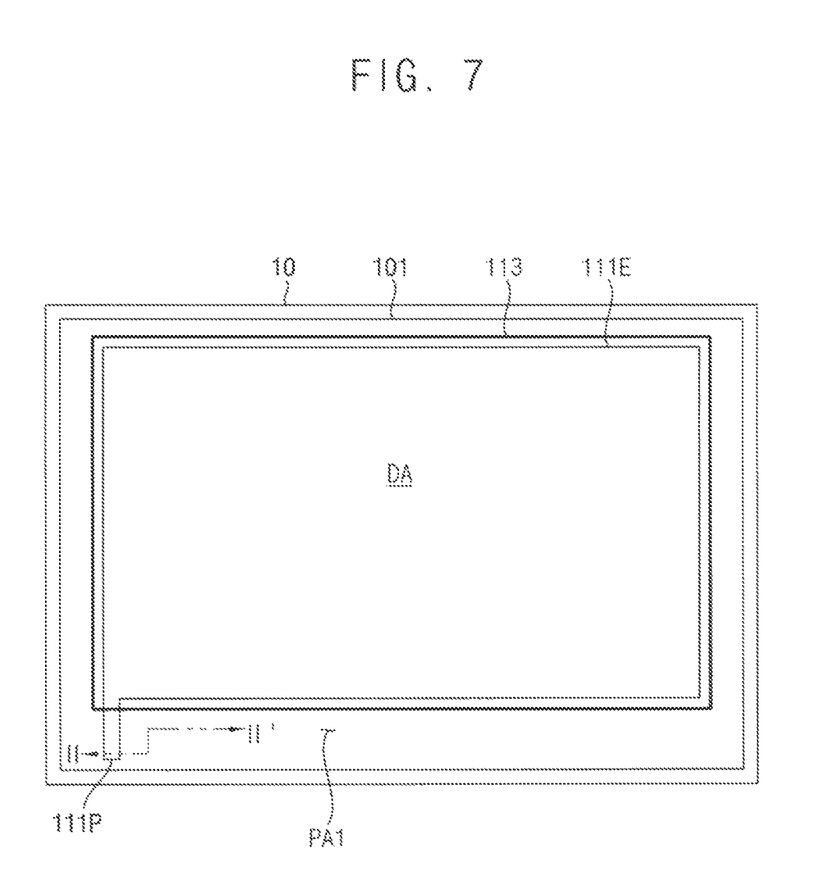
FIGS. 7, 8 and 9 are plan views illustrating one method of manufacturing a display panel according to an exemplary embodiment.
Figure 8:
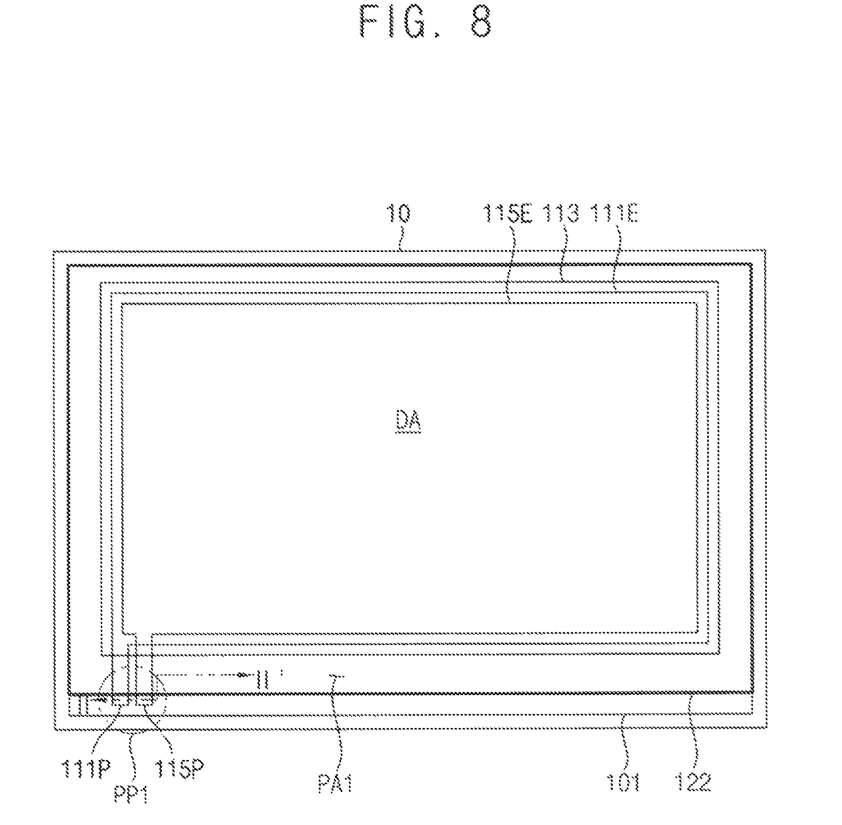
Figure 9:
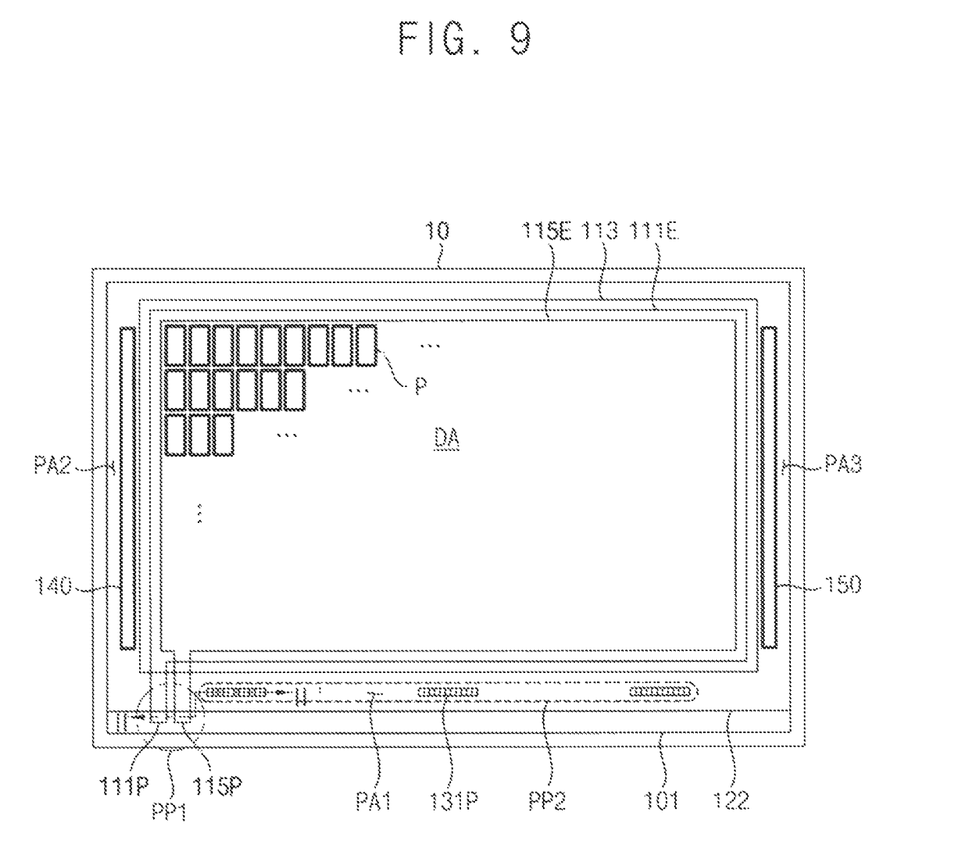

FIGS. 5 and 6 are cross-sectional views illustrating one method of manufacturing a display panel according to an exemplary embodiment. FIGS. 7 to 9 are plan views illustrating one method of manufacturing a display panel according to an exemplary embodiment.

Referring to FIGS. 5 and 7, a first polymer layer may be formed on a glass substrate 10. The first polymer layer may include transparent material, for example, polyimide, polyethylenenaphtalate, polyethyleneterephthalate, polyarylate, polycarbonate, polyrtherlmide, polyethersulfone, etc.

The first polymer layer may be cured to form the first flexible substrate layer 101. Thus, the first flexible substrate layer 101 may be formed on the glass substrate 10. The curing method may include heat curing, ultraviolet (UV) curing, electronbeam curing, etc.

A first barrier layer 102 may be formed on the first flexible substrate layer 101. The first barrier layer 102 may include inorganic materials such as metallic oxide, silicon oxide, silicon oxide, etc. For example, the first barrier layer 102 may include AlO3, SiO2, SiNx, etc. These may be used alone or in a suitable combination thereof.

A first transparent conductive layer may be formed on the first barrier layer 102. The first transparent conductive layer may include indium tin oxide (ITO), indium zinc oxide (IZO), etc. The first transparent conductive layer may be patterned to form a first transparent electrode 111E in the display area DA and a first pad electrode 111P connected to the first transparent electrode 111E in the first peripheral area PA1.

An electrochromic layer 113 may be formed on the first flexible substrate layer 101 on which the first transparent electrode 111E and the first pad electrode 111P are formed.

The electrochromic layer 113 may be formed on the first transparent electrode 111E to overlap with the first transparent electrode 111E corresponding to the display area DA. In addition, the electrochromic layer 113 may have a size larger than the first transparent electrode 111E, and thus an edge area of the electrochromic layer 113 may fully cover an edge area of the first transparent electrode 111E.

Referring to FIGS. 5 and 8, a second transparent conductive layer may be formed on the first flexible substrate layer 101 on which the electrochromic layer 113 is formed. The second transparent conductive layer may include indium tin oxide (ITO), indium zinc oxide (IZO), etc. The second transparent conductive layer may be patterned to form a second transparent electrode 115E and a second pad electrode 115P.

The second transparent electrode 115E may be formed in the display area DA to overlap with the first transparent electrode 111E. The second transparent electrode 115E may have a size smaller than the electrochromic layer 113, and thus an edge area of the electrochromic layer 113 may fully cover an edge area of the second transparent electrode 115E. The second pad electrode 115P may be connected to the second transparent electrode 115E and may be formed in the first peripheral area PA1 adjacent to the first pad electrode 111P.

Therefore, the first pad part PP1 is formed in the first peripheral area PA1 of the first flexible substrate layer 101.

A second barrier layer 121 may be formed on the first barrier layer 102 on which the second transparent electrode 115E and the second pad electrode 115P are formed. The second barrier layer 121 may include inorganic materials such as metallic oxide, silicon oxide, silicon oxide, etc. For example, the second barrier layer 121 may include AlO3, SiO2, SiNx, etc. These may be used alone or in a suitable combination thereof.

The second barrier layer 121 may be formed to expose the first pad part PP1 formed in the first peripheral area PA1.

A second polymer layer may be formed on the second barrier layer 121. The second polymer layer may include transparent plastic, for example, polyimide, polyethylenenaphtalate, polyethyleneterephthalate, polyarylate, polycarbonate, polyrtherlmide, polyethersulfone, etc.

The second polymer layer may be cured to form the second flexible substrate layer 122. The curing method may include heat curing, UV curing, electronbeam curing, etc.

As described above, the flexible electrochromic substrate 120 of the display panel 100 may be formed.

Referring to FIGS. 4, 5 and 9, a transistor layer 131 may be formed on the flexible electrochromic substrate 120. The transistor layer 131 may include a gate electrode, a gate line connected to the gate electrode, a source electrode, a data line connected to the source electrode and a drain electrode in the display area DA. The transistor layer 131 may include a second pad part PP2 in the first peripheral area PA1, a gate driver 140 in the second peripheral area PA2, and an emission driver 150 in the third peripheral area PA3.

The second pad part PP2 may include a plurality of signal pads 131P. The plurality of signal pads 131P may include a plurality of signal pads connected to a plurality of data lines in the display area DA. In addition, the plurality of signal pads 131P may be connected to signal lines that are connected to the gate driver 140 in the second peripheral area PA2. In addition, the plurality of signal pads 131P may be connected to the signal lines that are connected to the emission driver 150 in the third peripheral area PA3.

As described above, the second pad part PP2 may be formed in the first peripheral area PA1 of the second flexible substrate layer 122 in the flexible electrochromic substrate 120.

The OLED layer 133 may be formed on the flexible electrochromic substrate 120 on which the transistor layer 131 is formed.

The encapsulation layer 135 may be formed on the flexible electrochromic substrate 120 on which the OLED layer 133 is formed.

Referring to FIGS. 6 and 9, the display part 130 may be formed on the flexible electrochromic substrate 120.

The glass substrate 10 is detached from the flexible electrochromic substrate 120 by separating processes after the display part 130 is formed.

The separating processes may include irradiating ultraviolet (UV) light to a front face and a rear face of the glass substrate 10 on which the display part 130 is formed. The irradiated UV light may be absorbed by the first flexible substrate layer 101 and the second flexible substrate layer 122 formed on the glass substrate 10. A binding power between the first flexible substrate layer 101 and the glass substrate 10 may be decreased. Then, the separating processes may include separating the glass substrate 10 from the flexible electrochromic substrate 120 by an external tension.

Figure 10:
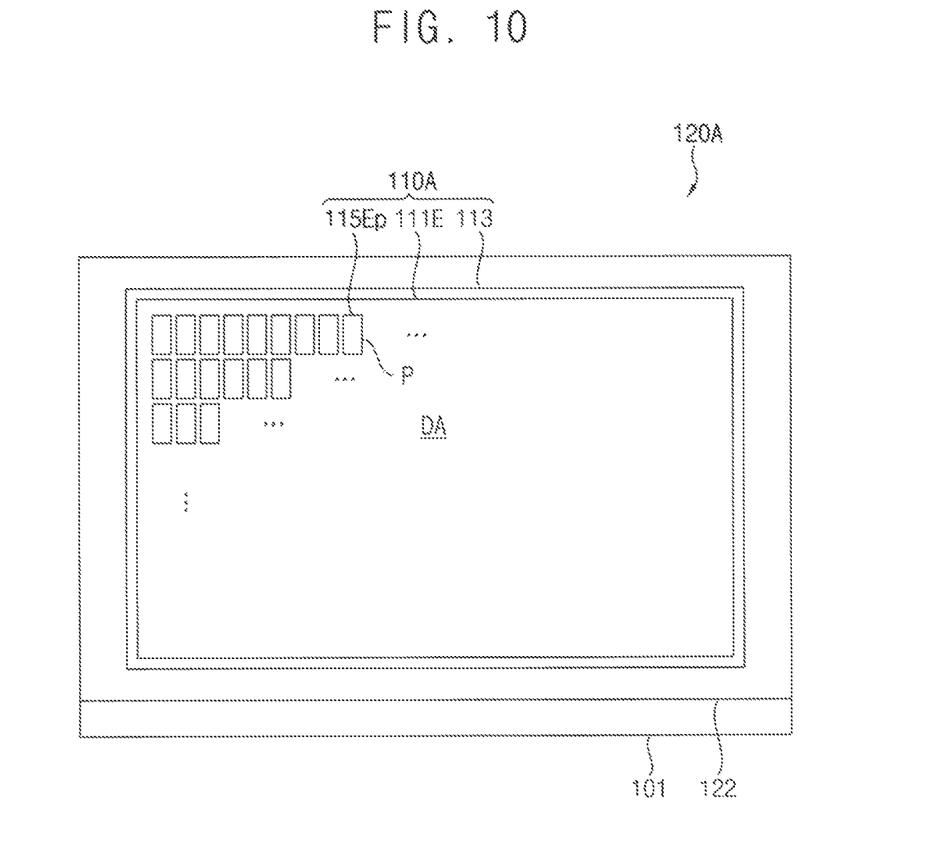
FIG. 10 is a conceptual diagram illustrating a flexible electrochromic substrate according to an exemplary embodiment.

FIG. 10 is a conceptual diagram illustrating a flexible electrochromic substrate according to an exemplary embodiment.

Referring to FIGS. 3 and 10, the flexible electrochromic substrate 120A may include a first flexible substrate layer 101, a first barrier layer 102, an electrochromic part 110A, a second barrier layer 121 and a second flexible substrate layer 122. The electrochromic part 110A may include a first transparent electrode 111E, an electrochromic layer 113 and a second transparent electrode 115E. At least one of the first and second transparent electrodes 111E and 115E may be patterned corresponding to the pixel.

For example, as shown in FIG. 10, the electrochromic part 110A may include a single first transparent electrode 111E and a plurality of second transparent electrodes 115Ep. The first transparent electrode 111E may be patterned corresponding to the display area DA. The plurality of second transparent electrodes 115Ep may be patterned respectively corresponding to a plurality of pixel areas.

Alternatively, not shown in figures, the electrochromic part 110A may include a plurality of first transparent electrodes corresponding to the plurality of pixel areas and a single second transparent electrode corresponding to the display area. Alternatively, the electrochromic part 110A may include a plurality of first transparent electrodes corresponding to the plurality of pixel areas and a plurality of second transparent electrodes corresponding to the plurality of pixel areas.

According to the exemplary embodiment, the electrochromic part 110A may be driven with the transparent mode or the opaque mode by a pixel unit (i.e., driven pixel by pixel).

Figure 11:
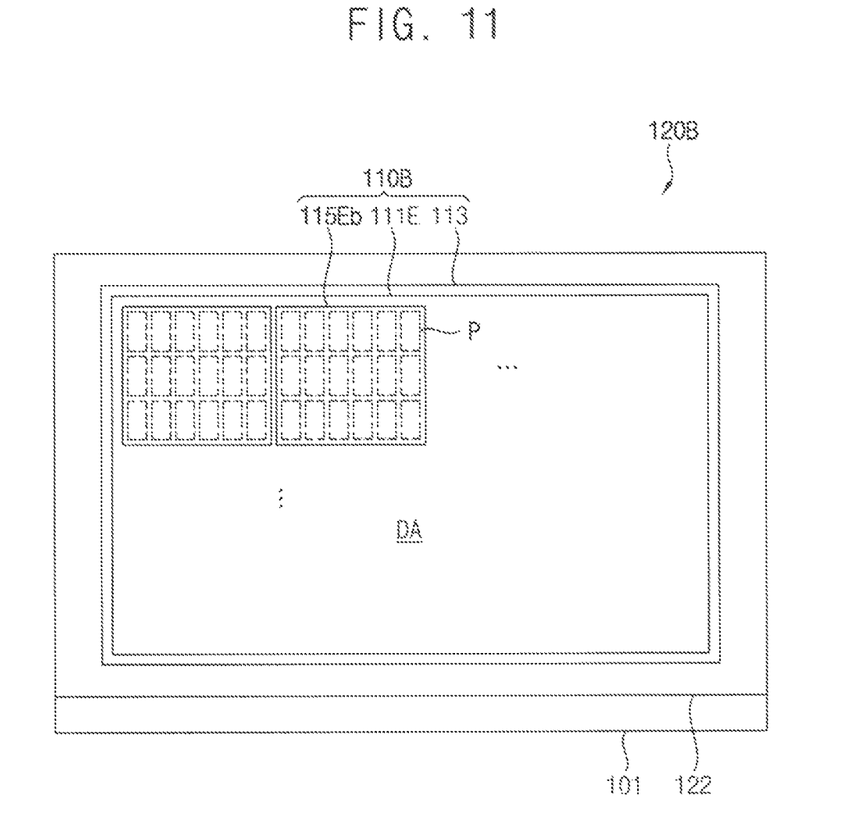
FIG. 11 is a conceptual diagram illustrating a flexible electrochromic substrate according to an exemplary embodiment.

FIG. 11 is a conceptual diagram illustrating a flexible electrochromic substrate according to an exemplary embodiment.

Referring to FIGS. 3 and 11, the flexible electrochromic substrate 120B may include a first flexible substrate layer 101, a first barrier layer 102, an electrochromic part 110B, a second barrier layer 121 and a second flexible substrate layer 122. The electrochromic part 110B may include a first transparent electrode 111E, an electrochromic layer 113 and a second transparent electrode 115E. At least one of the first and second transparent electrodes 111E and 115E may be patterned by a block area including a plurality of pixels. The block area may include the plurality of pixels arranged as a (M×N) matrix type ('M' and 'N' are natural numbers).

For example, as shown in FIG. 11, the electrochromic part 110B may include a single first transparent electrode 111E and a plurality of second block transparent electrodes 115Eb. The first transparent electrode 111E may be patterned corresponding to the display area DA, and the second block transparent electrodes 115Eb may be patterned corresponding to a plurality of block areas.

Alternatively, not shown in figures, the electrochromic part 110B may include a plurality of first block transparent electrodes and a single second transparent electrode. Alternatively, the electrochromic part 110B may include a plurality of first block transparent electrodes corresponding to the plurality of pixel areas and a plurality of second block transparent electrodes corresponding to the plurality of pixel areas.

According to the exemplary embodiment, the electrochromic part 110B may be driven with the transparent mode or the opaque mode by a block area unit.

According to the exemplary embodiments, the flexible electrochromic substrate includes the electrochromic part disposed between the first and second flexible substrate layers, and thus, a transparency of the display panel may be adjusted. Therefore, a visibility may be improved in an outdoor environment having sunlight. In addition, the flexible electrochromic substrate includes the first and second barrier layers disposed between the first and second flexible substrate layers and thus may block moisture or water permeated from the outside into the display panel.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A display panel comprising:
    a flexible electrochromic substrate comprising a first flexible substrate layer, a second flexible substrate layer opposing to the first flexible substrate layer, an electrochromic part disposed between the first and second flexible substrate layers and configured to discolor in response to a driving signal, a first barrier layer disposed on the first flexible substrate layer, and a second barrier layer disposed under the second flexible substrate layer;
    a transistor layer disposed on the flexible electrochromic substrate, the transistor layer comprising a plurality of transistors; and
    an organic light emitting diode layer disposed on the flexible electrochromic substrate on which the transistor layer is disposed, the organic light emitting diode layer comprising a plurality of organic light emitting diodes connected to the plurality of transistors,
    wherein the second flexible substrate layer is disposed between the transistor layer and the second barrier layer,
    wherein the electrochromic part comprises a first electrode, a second electrode, and an electrochromic layer, the electrochromic layer is disposed between the first electrode and the second electrode and overlaps the first electrode and the second electrode,
    wherein the electrochromic part is directly disposed between the first barrier layer and the second barrier layer in an area where the electrochromic part overlaps the first barrier layer and the second barrier layer,
    wherein the first barrier layer is in direct contact with the second barrier layer in an area where the electrochromic part does not overlap the first barrier layer and the second barrier layer, such that the electrochromic part is sealed by the first barrier layer and the second barrier layer,
    wherein a first pad part is disposed on the first barrier layer in an outer area other than an area where the first barrier layer is in direct contact with the second barrier layer, the second barrier layer being not disposed in the outer area, and
    wherein a second pad part is disposed in the area where the first barrier layer is in direct contact with the second barrier layer.

2. The display panel of claim 1, wherein the electrochromic layer is directly disposed between the first and second electrodes.

3. The display panel of claim 2, wherein at least one of the first electrode and the second electrode in the electrochromic part is patterned corresponding to a pixel.

4. The display panel of claim 2, wherein at least one of the first electrode and the second electrode in the electrochromic part is patterned corresponding to a block area including a plurality of pixels.

5. The display panel of claim 1, wherein the flexible electrochromic substrate comprises a display area in which the plurality of organic light emitting diodes are arranged and a peripheral area surrounding the display area.

6. The display panel of claim 1, wherein the first pad part comprises a first pad electrode extending from the first electrode and a second pad electrode extending from the second electrode.

7. The display panel of claim 1, wherein the first pad part is disposed adjacent to the second pad part.

8. The display panel of claim 1, wherein the first pad part is exposed in the outer area.

9. The display panel of claim 2, wherein the electrochromic layer covers edge areas of the first electrode and has a size greater than that of the first electrode.

10. The display panel of claim 9, wherein the electrochromic layer covers edge areas of the second electrode and has a size greater than that of the second electrode.

11. A display apparatus comprising:
a display panel comprising a flexible electrochromic substrate comprising:
a first flexible substrate layer, a second flexible substrate layer opposing to the first flexible substrate layer, an electrochromic part disposed between the first and second flexible substrate layers and configured to discolor in response to a driving signal, a first barrier layer disposed on the first flexible substrate layer, and a second barrier layer disposed under the second flexible substrate layer,
a transistor layer disposed on the flexible electrochromic substrate, the transistor layer comprising a plurality of transistors, and an organic light emitting diode layer comprising a plurality of organic light emitting diodes connected to the plurality of transistors;
a first flexible circuit board disposed on the first flexible substrate layer and configured to provide the electrochromic part with a driving signal; and
a second flexible circuit board disposed on the second flexible substrate layer and configured to provide the plurality of transistors with a driving signal,
wherein the second flexible substrate layer is disposed between the transistor layer and the second barrier layer,
wherein the electrochromic part comprises a first electrode, a second electrode, and an electrochromic layer, the electrochromic layer is disposed between the first electrode and the second electrode and overlaps the first electrode and the second electrode,
wherein the electrochromic part is directly disposed between the first barrier layer and the second barrier layer in an area where the electrochromic part overlaps the first barrier layer and the second barrier layer,
wherein the first barrier layer is in direct contact with the second barrier layer in an area where the electrochromic part does not overlap the first barrier layer and the second barrier layer, such that the electrochromic part is sealed by the first barrier layer and the second barrier layer,
wherein a first pad part is disposed on the first barrier layer in an outer area other than an area where the first barrier layer is in direct contact with the second barrier layer, the second barrier layer being not disposed in the outer area, and
wherein a second pad part is disposed in the area where the first barrier layer is in direct contact with the second barrier layer.

12. The display apparatus of claim 11, wherein the electrochromic layer is directly disposed between the first and second electrodes.

13. The display apparatus of claim 12, wherein at least one of the first electrode and the second electrode in the electrochromic part is patterned corresponding to a pixel.

14. The display apparatus of claim 12, wherein at least one of the first electrode and the second electrode in the electrochromic part is patterned corresponding to a block area including a plurality of pixels.

15. The display apparatus of claim 11, wherein the flexible electrochromic substrate comprises a display area in which the plurality of organic light emitting diodes are arranged and a peripheral area surrounding the display area.

16. The display apparatus of claim 11, wherein the first pad part comprises a first pad electrode extending from the first electrode and a second pad electrode extending from the second electrode.

17. The display apparatus of claim 11, wherein the first pad part is disposed adjacent to the second pad part.

18. The display apparatus of claim 11, wherein the first pad part is exposed in the outer area.

19. The display apparatus of claim 12, wherein the electrochromic layer covers edge areas of the first electrode and has a size greater than that of the first electrode.

20. The display apparatus of claim 12, wherein the electrochromic layer covers edge areas of the second electrode and has a size greater than that of the second electrode.

* * * * *